United States Patent [19]
Hause et al.

[11] Patent Number: 6,166,354
[45] Date of Patent: Dec. 26, 2000

[54] SYSTEM AND APPARATUS FOR IN SITU MONITORING AND CONTROL OF ANNEALING IN SEMICONDUCTOR FABRICATION

[75] Inventors: Frederick N. Hause; Robert Dawson; H. Jim Fulford, Jr., all of Austin; Mark I. Gardner, Cedar Creek; Mark W. Michael, Cedar Park; Bradley T. Moore; Derick J. Wristers, both of Austin, all of Tex.

[73] Assignee: Advanced Micro Devices, Inc., Sunnyvale, Calif.

[21] Appl. No.: 08/876,381

[22] Filed: Jun. 16, 1997

[51] Int. Cl.[7] ........................................ F27B 5/14
[52] U.S. Cl. ...................... 219/390; 438/14; 118/725; 324/751; 427/508
[58] Field of Search .................. 438/14, 16, 17; 219/390, 411; 392/418; 118/725, 50.1; 324/751, 752, 760; 427/508, 521, 554, 555, 556, 557, 596, 597

[56] References Cited

U.S. PATENT DOCUMENTS 5,581,194  12/1996  Lowell ...................................... 324/752
5,714,392   2/1998  Dawson et al. ............................. 437/8

OTHER PUBLICATIONS

Silicon Processing for the VLSI Era—vol. 1: Process Technology, by S. Wolf, published by Lattice Press, Sunset Beach, CA, 1986, pp. 182–327.
Silicon Processing for the VLSI Era—vol. 2: Process Integration, by S. Wolf, published by Lattice Press, Sunset Beach, CA, 1990, pp. 124–131.

*Primary Examiner*—Teresa Walberg
*Assistant Examiner*—Shawntina P. Fuqua
*Attorney, Agent, or Firm*—Skjerven Morrill MacPherson LLP; Ken J. Koestner; Theodore P. Lopez

[57] ABSTRACT

An optical monitoring of electrical characteristics of devices in a semiconductor is performed during an anneal step to detect the time annealing is complete and activation occurs. A surface photovoltage measurement is made during annealing to monitor the charge state on the surface of a substrate wafer to determine when the substrate is fully annealed. The surface photovoltage measurement is monitored, the time of annealing is detected, and a selected over-anneal is controlled. The surface photovoltage (SPV) measurement is performed to determine a point at which a dopant or impurity such as boron or phosphorus is annealed in a silicon lattice. In some embodiments, the point of detection is used as a feedback signal in an RTA annealing system to adjust a bank of annealing lamps for annealing and activation uniformity control. The point of detection is also used to terminate the annealing process to minimize $D_t$.

22 Claims, 5 Drawing Sheets

PHOTOVOLTAIC EFFECT IN UNBIASED P-N JUNCTION

*FIG.3A*

CONTACT EQUILIBRIUM

PHOTOVOLTAIC EFFECT IN METAL-SEMICONDUCTOR CONTACT

SYSTEM AND APPARATUS FOR IN SITU MONITORING AND CONTROL OF ANNEALING IN SEMICONDUCTOR FABRICATION

BACKGROUND OF THE INVENTION

1. Field of the Invention

The present invention relates to a semiconductor fabrication method and apparatus employing a rapid thermal annealing (RTA) process. More specifically, the present invention relates to an RTA system and method having improved monitoring and control of annealing and device activation.

2. Description of the Related Art

Rapid thermal annealing (RTA) is a semiconductor fabrication technique using short-time, high temperature processing to avoid unwanted dopant diffusion that would otherwise occur at the high processing temperatures of 900° C. to 1000° C. or greater that are used to dissolve extended defects in silicon (Si) and gallium arsenide (GaAs). The duration of an RTA process ranges from seconds to a few minutes so that semiconductor substrates are subjected to high temperatures only long enough to attain a desired process effect but not so long that a large degree of dopant diffusion takes place. RTA is typically performed in specially-designed systems rather than conventional furnaces or reactors which include susceptors, wafer boats and reactor walls having a large thermal mass which prevents performance of rapid thermal cycling. Early RTA processes used lasers as an energy source, allowing a high degree of heating to occur within fractions of a microsecond without significant thermal diffusion. Unfortunately, the wafer surfaces had to be scanned by small spot-size laser beams, causing lateral thermal gradients and wafer warping.

Subsequently, large-area incoherent energy sources were developed to overcome these limitations. These energy sources emit radiant light, which then heats the wafers, allowing very rapid and uniform heating and cooling. RTA systems have been developed in which wafers are thermally isolated so that radiant, not conductive, heating and cooling predominates. Temperature uniformity is a primary design consideration in these systems so that thermal gradients, which cause slip and warpage, are avoided. RTA systems use various heat sources including arc lamps, tungsten-halogen lamps, and resistively-heated slotted graphite sheets.

Thermal processing, such as RTA, is used in many steps of device fabrication in silicon wafers. Thermal processing is used to remove defects in silicon substrate which result from processing steps having a destructive effect. One example of a processing step having a destructive effect is ion implantation, the introduction of selected impurity dopants into a substrate using high-voltage ion bombardment to modify electronic properties of the substrate.

Thermal processing does more than simply repair implantation damage. Thermal processing is also highly useful for electrically activating the implanted impurity atoms. Upon implantation most implanted impurities do not occupy substitutional sites in the substrate.

One technique for determining the effectiveness of thermal activation of impurities is to perform Hall effect measurements. A Hall effect measurement is difficult to make in a process wafer, involving the placing of a current-carrying conductor in a magnetic field having a direction perpendicular to the direction of the current and the wafer surface.

Thermal activation is alternatively checked more simply by measuring the sheet resistance $R_s$ of the substrate wafer. A problem with Hall effect measurements, sheet resistance measurements, and other electrical measurements are that the measurements are very difficult to make while annealing is taking place. In some cases, voltages are generated due to junctions in the wafers.

Because electrical measurements are generally not available during the annealing process, annealing is conventionally monitored by measuring temperature of a substrate wafer and activation is presumed to occur at a particular temperature or when a defined temperature is applied for a designated time duration.

However, several difficulties arise in achieving temperature uniformity. First, to raise the temperature of a semiconductor wafer of course requires heating of the slide carriers and insertion equipment for handling the wafer. The large thermal mass of slide carriers and insertion equipment extend the process times to obtain reproducible results. Significant changes in the doping profile of the wafer can occur over this time, causing difficulty in forming a desired structure in the substrate. For example, the precise alignment of shallow junctions becomes difficult to control when the temperature is not controllable.

A second problem is that dopants such as arsenic can be lost through preferential evaporation effects. In GaAs, arsenic loss is severe with considerable deterioration of the semiconductor material unless the semiconductor is appropriately capped.

Temperature uniformity is typically tested by measuring the emissivity of a semiconductor wafer using an optical pyrometer, such as an infrared pyrometer. Emissivity is defined as the ratio of power per unit area radiated from a surface to the power radiated by a black body at the same temperature when radiation is produced by the thermal excitation or agitation of atoms or molecules. When a semiconductor wafer is heated, such as occurs in rapid thermal annealing, the temperature of the wafer is raised and the increase in temperature is detectable by an optical signal with a characteristic spectrum that is indicative of the wafer temperature. Ideally a measurement of emissivity quantifies the characteristic spectrum.

Thus, the conventional usage of an infrared pyrometer ignores emissivity in other regions of the spectrum, tantamount to an assumption that emissivity occurs at a constant level across a broad spectrum and that the infrared regions is highly representative of the emissivity of the broad spectrum. However, these assumptions are erroneous.

As a semiconductor wafer is illuminated, the wafer absorbs part of the energy and reflects part of the energy. The relative amount of energy reflected and absorbed is highly dependent on the type of films on the wafer, which may be highly variable from wafer to wafer. The relative amount of energy that is reflected and absorbed is highly position-dependent in the wafer. The wafer surface generally includes various oxides, polysilicon, deposited oxides and the like, generally having variable thicknesses and types. Differences in both the type of material and the thickness of the material on the semiconductor wafer relate to variability in the absorption and reflectivity of local areas of the wafer, causing variations in emissivity at different regions of the semiconductor wafer. For example, absorption of radiant heat by the semiconductor wafer is related to the free carrier concentration so that the heating rate for heavily doped material is more rapid than for semiconductor wafers with less doping.

Nulls occasionally occur in which substantially no energy is reflected and thereby detected by the infrared pyrometer.

In particular, the various types of deposits and deposition thicknesses act as a quarter-wave plate in which energy is absorbed in a material of a particular type and thickness which is coincident with the effective wavelength of the pyrometer so that a quarter-wave path difference with a relative phase shift of 90° occurs between ordinary and extraordinary waves. Thus, substantially all of the energy at the effective wavelength of the pyrometer is absorbed in the material and very little is reflected. The pyrometer badly misjudges the temperature of the wafer in these regions, measuring a temperature that is much lower than the actual temperature.

The temperature measurement system is typically used in a feedback control system which responds to the detected low temperature by increasing the intensity of the heating lamps or extending the duration of annealing. The increase in RTA processing damages or destroys the semiconductor wafer in process.

Present day rapid thermal anneal systems typically address the problems of emissivity measurement variations and temperature measurement inaccuracies by attempting to construct an ideal RTA chamber, specifically an RTA chamber which is most equivalent to a black body radiator so that the only energy absorbing component in the chamber is the semiconductor wafer. However, even with an ideal RTA chamber, absorption by the semiconductor wafer introduces variability in temperature measurement that may not be compensated.

Another problem with monitoring annealing and activation using a temperature measurement is that the absorption of energy by the wafer depends not only on temperature but also on many other factors including dopant concentration. As impurities become activated, the absorption of energy is modified.

Furthermore, variability in activation temperature is inherent throughout the substrate wafer due to constructive and destructive interference in systems using optical temperature measurements such as optical pyrometers. Commonly rapid thermal anneal chambers supply heat using lamps on both the frontside and the backside of a wafer. The backside of a wafer typically has multiple films with different optical properties. The variability in optical properties leads to constructive and destructive interference which makes a temperature measurement highly variable.

What is needed is a method and system for monitoring and accurately controlling activation of impurities or dopants in a rapid thermal anneal system. What is further needed is a method and apparatus for determining the conditions of annealing in a substrate wafer at which an impurity such as boron and phosphorus is annealed in a silicon lattice using an optical monitoring technique.

SUMMARY OF THE INVENTION

In accordance with the present invention, optical monitoring of electrical characteristics of devices in a semiconductor is performed during an anneal step to detect the time annealing is complete and activation occurs.

In accordance with an embodiment of the present invention, a surface photovoltage measurement is made during annealing to monitor the charge state on the surface of a substrate wafer to determine when the substrate is fully annealed. The surface photovoltage measurement is monitored, the time of annealing is detected, and a selected over-anneal is controlled.

The surface photovoltage (SPV) measurement is performed to determine a point at which a dopant or impurity such as boron or phosphorus is annealed in a silicon lattice. In some embodiments, the point of detection is used as a feedback signal in an RTA annealing system to adjust a bank of annealing lamps for annealing and activation uniformity control. The point of detection is also used to terminate the annealing process to minimize $D_t$.

Several advantages are achieved by the described process method and semiconductor process apparatus. The surface photovoltage measurement advantageously supplies monitoring and control of a region of a substrate wafer ranging in size from a relatively large region to a compact region which is larger than a single junction, yet sufficiently small to determine the impurity activation of a small number of semiconductor devices. It is advantageous that the described method and apparatus controls annealing more precisely than the conventional technique empirically based on a time and temperature recipe. One advantage is that the effects of annealing inside an RTA chamber are more accurately measured. Another advantage is that the improved accuracy of monitoring of annealing allows for improved temperature control in the chamber. A further advantage is that usage of a surface photovoltage measurement (SPV) apparatus attains a high spectral resolution and a high updating rate of several times per second so that a feedback control system achieves a rapid response.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION OF THE PREFERRED EMBODIMENTS

Figure 1:
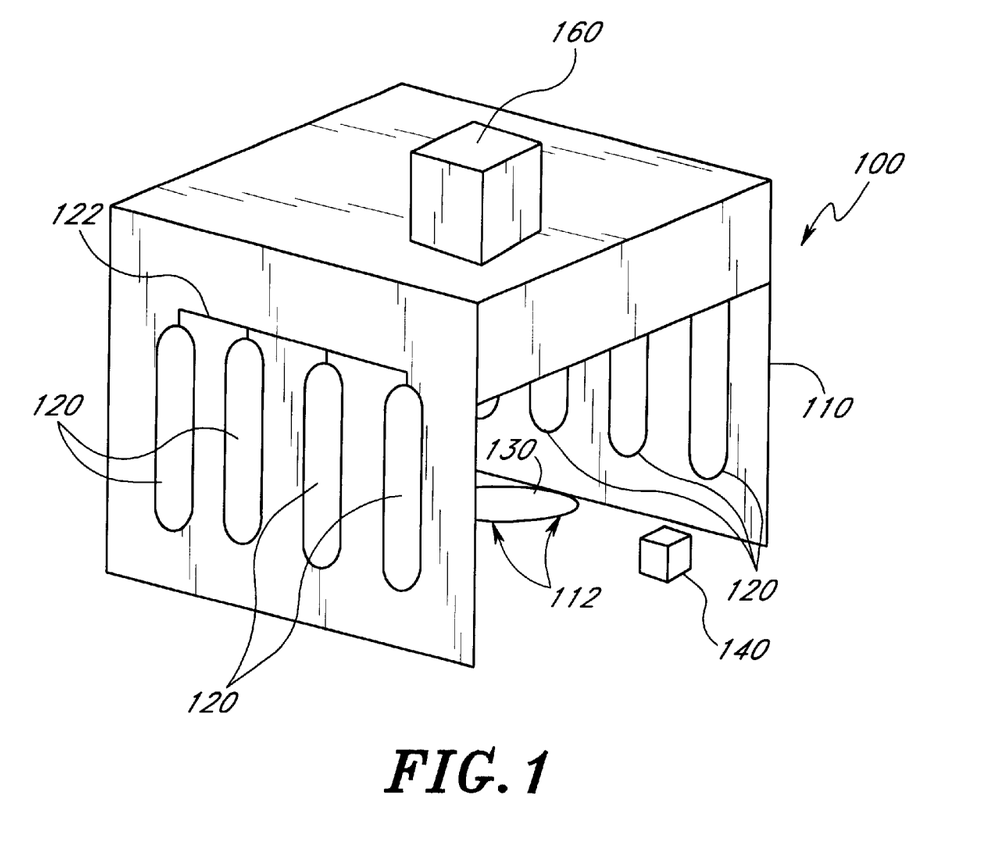
FIG. 1 is a schematic block diagram depicting a rapid thermal annealing (RTA) system in accordance with one embodiment of the present invention.

Referring to FIG. 1, a schematic block diagram illustrates a water-cooled rapid thermal anneal (RTA) system 100 including an RTA chamber 110, a plurality of tungsten halogen lamps 120 for heating a semiconductor wafer 130 within the RTA chamber 110, and a surface photovoltage (SPV) measurement device 140 for monitoring device activation and annealing of the semiconductor wafer 130. Point supports 112 hold the semiconductor wafer 130 to alleviate thermal mass effects. The temperature is monitored by measuring surface charge in the semiconductor wafer 130 and using feedback control based on the surface charge measurement to control heating by the lamps 120. The RTA system 100 further includes a control circuit 160 connected to the surface photovoltage measurement device 140 to receive a control signal and connected to the tungsten halogen lamps 120 to control heating by the lamps 120 as a function of the control signal.

The control circuit 160 is connected to the surface photovoltage measurement device 140 to receive signals indicative of surface charge and, therefore, annealing and, indirectly, temperature within the RTA chamber 100. Control circuits with connections to a measurement device such as a surface photovoltage measurement device 140 for implementing a monitoring and control process include processors, state machines, control logic circuits and the like. The control circuit 160, which includes switches and an adjuster such as a potentiometer for controlling the time and intensity of heating. Analog or digital circuits with connections to heating elements for controlling the time and intensity of heating are well known.

RTA chamber 110 is a heating chamber supplying a controlled environment for the semiconductor wafer 130 and for supplying energy from the lamps 120 to the semiconductor wafer 130. The RTA chamber 110 forms an air-tight structure so that heating is supplied under conditions of inert atmospheres of argon (Ar) and nitrogen ($N_2$) or a vacuum. In some RTA systems, oxygen and ammonia are supplied for growth of oxide ($SiO_2$) and nitride ($Si_3N_4$) into an RTA chamber. Also NO or $N_2O$ may be introduced to form (nitrodize) a nitridated oxide ($SiO_2$) layer.

A plurality of lamps 120, such as arc lamps, tungsten-halogen lamps and the like, are arranged about the RTA chamber 110. In the illustrative RTA system 100, the lamps 120 are arranged in a suitable linear array 122. In other embodiments, the lamps 120 are arranged in other suitable formations including, for example, an hexagonal array of lamps. The lamps 120 have a controlled intensity. In some embodiments, all lamps are controlled commonly. In other embodiments, each lamp is individually controlled. Switched incoherent heat sources are typically used although coherent heat sources may also be used.

Figure 2:
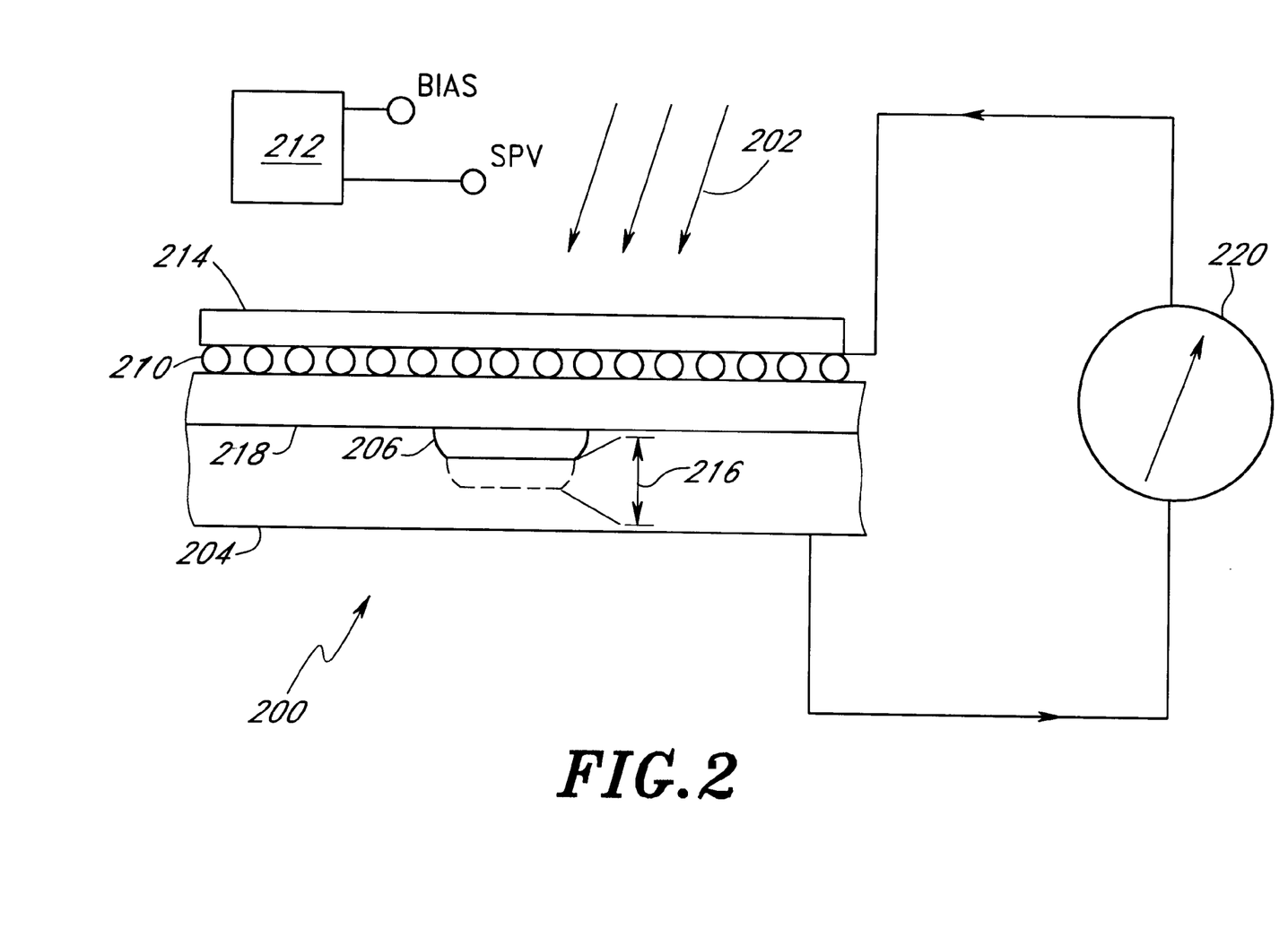
FIG. 2 is a pictorial block diagram showing a surface photovoltage (SPV) measurement device used to measure electrical characteristics of semiconductor devices in situ in a substrate wafer without attaching electrodes or other contacts to the wafer.

Referring to FIG. 2, a surface photovoltage (SPV) measurement device 200 is used to measure electrical characteristics of semiconductor devices in the substrate wafer without attaching electrodes or other contacts to the wafer. The surface photovoltage (SPV) measurement is performed in association with a MOS transistor formed on a surface of a semiconductor wafer. Varying amounts of charge occur due to the different films deposited or grown on an oxide surface of the MOS transistor. The SPV measurement is used to measure drift, flat-band voltage, surface states, and oxide thickness. The substrate wafer 204 is composed of a plurality of MOS semiconductor devices which, in turn, include a plurality of metal-semiconductor junctions. The metal-semiconductor junctions inherently form a photovoltaic cell, a cell that utilizes the photovoltaic effect to produce an electromagnetic field. The photovoltaic cells are activated by electromagnetic radiation by virtue of the formation of a potential barrier across the unbiased metal-semiconductor junction, producing a Schottky effect. The SPV measurement device 200 exploits the photovoltaic nature of the metal-semiconductor junctions to sense the electromagnetic field (EMF) and measure electrical characteristics of the MOS semiconductor devices based on the sensed EMF.

The photovoltaic effect results when a junction between two dissimilar materials, here a metal-semiconductor junction in a MOS semiconductor device, is exposed to electromagnetic radiation. The electromagnetic radiation is typically in a range of wavelengths between near ultraviolet and infrared. The electromagnetic radiation exposure creates a forward voltage across the illuminated junction. The SPV measurement device 200 includes a power source 220 which is connected to power the forward voltage across the junction. The charge transfer associated with the forward voltage forms a depletion region and, therefore, an unbiased p/n junction with a potential difference across the junction.

Figure 3A:
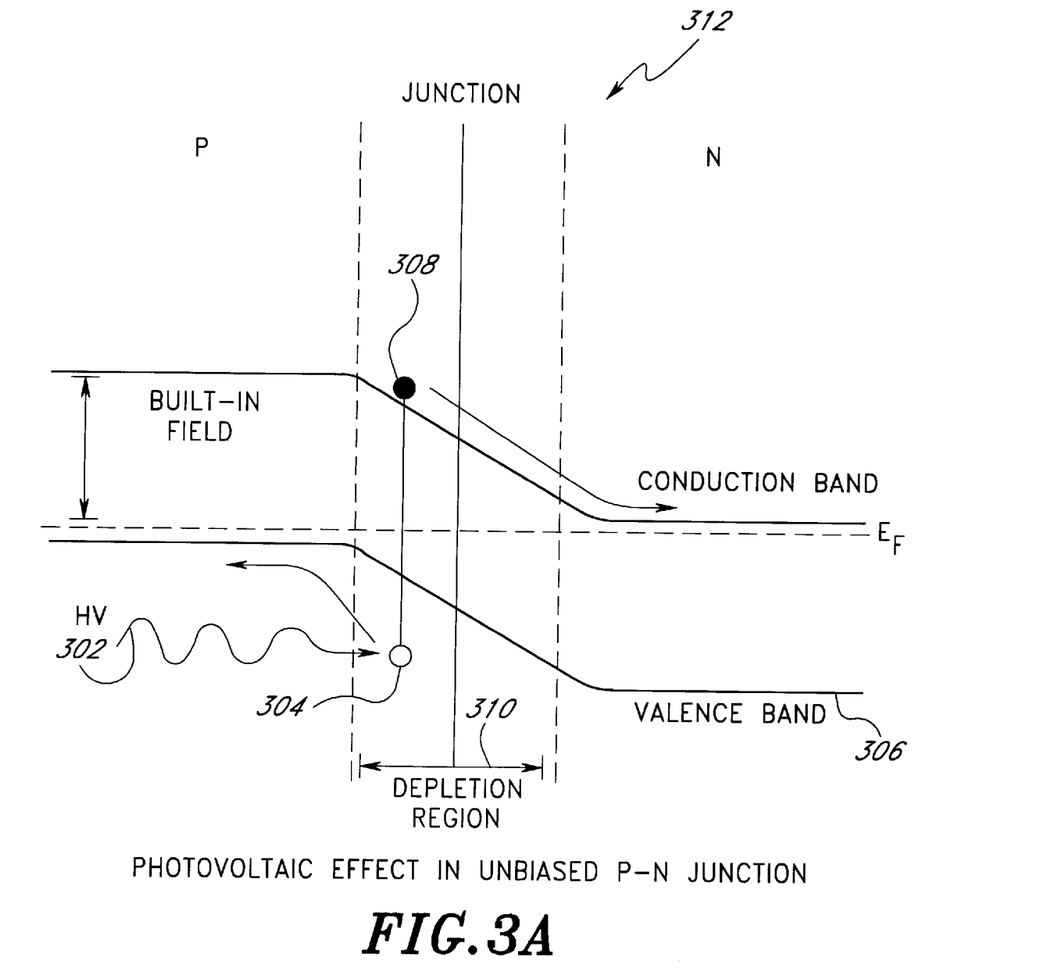
FIGS. 3A and 3B are graphs respectively showing energy bands for a p-n junction and for a metal-semiconductor junction where energy $E_F$ is shown as a function of position within the substrate wafer.
Figure 3B:
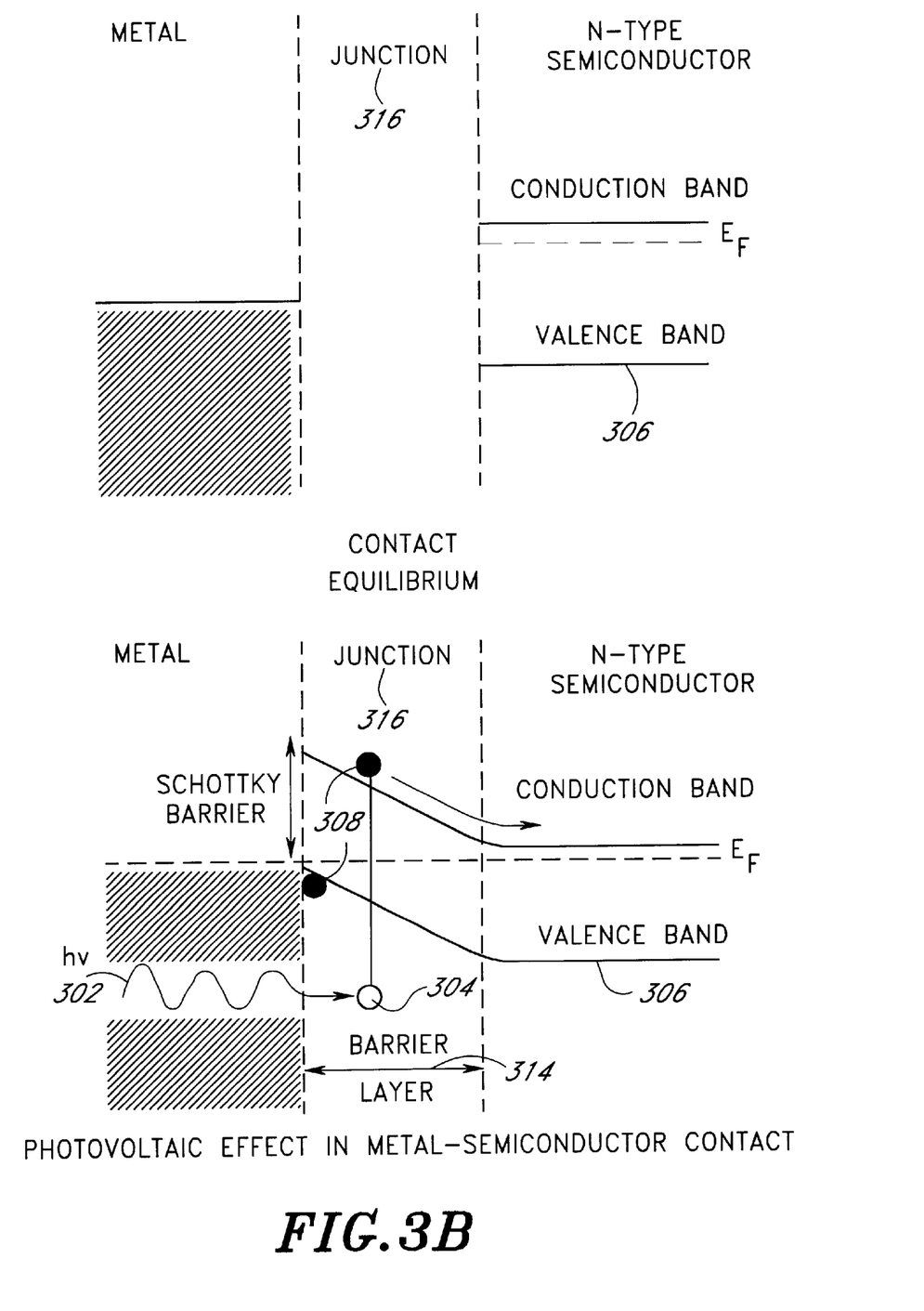

Referring to FIG. 3A and 3B, energy bands are respectively shown for a p-n junction and for a metal-semiconductor junction where energy $E_F$ is shown as a function of position within the substrate wafer. Incident radiation 302 supplies energy to electrons 304 in the valence band 306 and electron-hole pairs 308 are formed in the depletion region 310 in the vicinity of the p-n junction 312 or in the barrier layer 314 at the metal-semiconductor junction 316. Electron-hole pairs 308 are produced and cross the p-n junction 312 due to the electromagnetic field resulting from the illumination. The electron-hole pairs 308 produce a forward bias due to excess holes moving into the p-type semiconductor or the metal causing a positive bias or due to electrons moving to the n-type semiconductor and causing a negative bias.

The SPV measurement device 200 includes a mesh 210 which is shown in contact with an n-type semiconductor region 206 of the substrate wafer 204. The mesh 210 reduces reflections of the incident radiation 202. The illustrative photovoltaic cell is a "front-wall" cell since the metal-semiconductor junction 218 is the region exposed to the radiation. A surface photovoltage 216 is measured by a meter 212 connected to a pickup plate 214. In some embodiments, the arrangement is reversed and a Schottky barrier is at the back portion of the photovoltaic cell, the cell is described as a "back-wall" photovoltaic cell. Front-wall photovoltaic cells are generally more sensitive to blue-wavelength radiation and generate a higher output signal than back-wall photovoltaic cells since most radiation is absorbed in the vicinity of the potential barrier and the absorption losses are small. Back-wall photovoltaic cells are typically more sensitive to red-wavelength radiation since other components of the light are absorbed in the semiconductor before reaching the potential barrier layer.

Figure 4:
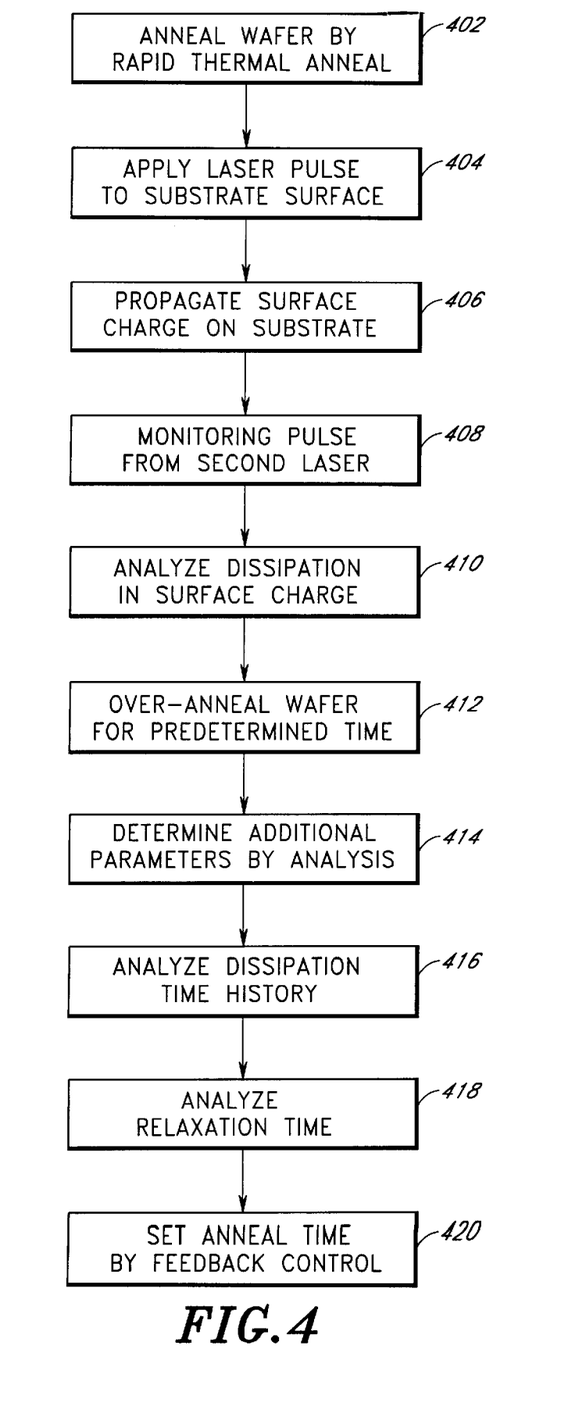
FIG. 4 is a flow chart illustrating a method of monitoring the state charge of the surface of a substrate wafer to determine when a substrate is fully annealed.

Referring to FIG. 4, a flow chart illustrates a method of monitoring the state charge of the surface of a substrate wafer to determine when the substrate is fully annealed. A substrate wafer is annealed 402 in a rapid thermal anneal chamber including a surface photovoltage measurement apparatus (SPV). During the annealing process 402, the SPV pulses a selected surface region of the substrate with a laser pulse 404. The laser pulse generates a surface charge which spreads from the pulsed region and propagates along the substrate surface 406. A second laser, specifically a monitoring laser, is pulsed to monitor the dissipation of the surface charge generated by the first pulse 408. The dissipation in surface charge is analyzed 410 to determine the dopant concentration in the substrate and to determine when the substrate is fully annealed. When it is determined that the substrate is fully annealed, annealing is continued for a predetermined time duration 412 to control over-annealing of the wafer. Other parameters are determined by analysis of the dissipation time of the surface charge 414. For example, in some embodiments the time history of dissipation is analyzed 416 to determine the contaminant levels within the substrate, to determine the state of a particular dopant, and to determine which elements bind a particular impurity. For example, in substrates containing iron, boron and arsenic impurities have a substantially different behavior. The difference in behavior arises because boron and iron form a complex that changes the relaxation time of the surface charge. For example, an iron and boron complex dissociates at about 200° C. and takes hours to reform.

Following analysis of the relaxation time, a feedback control step 418 sets the anneal time according to the surface charge measurement and results of the analysis. The time duration and temperature are precisely set to precisely attain a selected impurity state within the substrate wafer and to terminate the annealing process to minimize $D_t$. The relaxation time is used as a feedback signal in the RTA annealing system to adjust a bank of annealing lamps for annealing and activation uniformity control.

In an alternative embodiment of a rapid thermal annealing (RTA) system, substrate electrical properties are measured using an alternative optical measurement. For example, an emission microscopy measurement is made in which an operating semiconductor releases emissions of visible light. Various conditions of device performance are indicated by the released emissions in the vicinity of a semiconductor device. For example, junction leakage resulting from contamination or damage can create detectable light at the surface of a junction. A microscope enhanced by sensitive photodetectors and charge-coupled imaging devices (CCDs) is used to locate and generate an image of the diagnostic illumination.

In an alternative embodiment of a rapid thermal annealing (RTA) system, substrate electrical properties are measured using an alternative optical measurement, specifically an optical layer thickness measurement. The color of an semiconductor wafer has diagnostic importance. Silicon dioxide and silicon nitride exhibit colors on the substrate wafer. Silicon dioxide, which is more commonly known outside the technical arts as glass, is transparent. An oxidized silicon wafer has a color resulting from an interference phenomenon.

The silicon dioxide layer formed on a silicon wafer is described in optical terms as a thin transparent film on a reflecting substrate. When the silicon wafer is illuminated, some light rays impinging on the wafer surface reflect from the silicon dioxide surface while other light rays pass through the transparent silicon dioxide and reflect off the mirrored wafer surface. When the light rays exit the silicon dioxide layer film, the light rays combine with the surface-reflected ray, giving the surface the appearance of color. As the angle of viewing changes, the combination of light rays changes, changing the color of the wafer.

The particular color of a wafer is a function of three factors including the index of refraction of the transparent film material, the viewing angle, and the thickness of the film. The color of a thin transparent film is indicative of the thickness of the film when the nature of the viewing light (for example, fluorescent light or daylight) and thus the wavelength is specified, and the viewing angle is specified. However, color alone is insufficient to precisely indicate thickness due to interference.

For progressively thicker films, colors change in a specific sequence and then repeat the sequence. Each repetition of the color is called an order.

Film-thickness interference and reflectance measurements are automated using a spectrophotometer. Monochromatic light in the ultraviolet range is reflected from the wafer and analyzed by a photocell. Measurements are made under different conditions which are varied by changing the wavelength of the incident monochromatic light or by changing the angle of the wafer and the impinging ion beam. The spectrophotometer includes a processor for controlling the measurement conditions and to calculate the film thickness and index of refraction.

Ellipsometers are instruments for measuring film thickness that use a laser light source and operate on a different principle than the spectrophotometer. The laser light source is polarized.

While the invention has been described with reference to various embodiments, it will be understood that these embodiments are illustrative and that the scope of the invention is not limited to them. Many variations, modifications, additions and improvements of the embodiments described are possible. For example, the surface photovoltage measurement is described in terms of a two-laser system in which a first laser generates a laser pulse that is detecting using a second laser. In other embodiments only a single monitoring laser is used with a single laser generating an activation and measurement laser pulse using a precise timing circuit to set the time delay between activation and measurement.

What is claimed is:

1. An anneal system for annealing a substrate wafer within, the anneal system comprising:
    an anneal chamber for annealing the substrate wafer positioned within the anneal chamber;
    a heating lamp disposed in the vicinity of the anneal chamber for heating the substrate wafer interior to the anneal chamber; and
    a surface photovoltage detector disposed within the anneal chamber for detecting a surface charge of a surface of the substrate wafer and for sensing dissipation of the surface charge.

2. An anneal system according to claim 1 wherein:
    the anneal chamber is a rapid thermal anneal chamber for rapid thermal annealing the substrate wafer.

3. An anneal system according to claim 1 further comprising:
    a controller coupled to the heating lamp for applying a heating control signal to the heating lamp and coupled to the surface photovoltage detector for receiving a signal indicative of a surface charge measurement detected by the surface photovoltage detector.

4. An anneal system for annealing a substrate wafer within, the anneal system comprising:
    an anneal chamber for annealing the substrate wafer positioned within the anneal chamber;
    a heating lamp disposed in the vicinity of the anneal chamber for heating the substrate wafer interior to the anneal chamber; and
    a surface photovoltage detector disposed within the anneal chamber for detecting a surface charge of a surface of the substrate wafer, the surface photovoltage detector including:
        a first laser for pulsing the substrate wafer surface and generating said surface charge; and
        a second laser for sensing dissipation of the generated surface charge.

5. An anneal system for annealing a substrate wafer within, the anneal system comprising:
    an anneal chamber for annealing the substrate wafer positioned within the anneal chamber;
    a heating lamp disposed in the vicinity of the anneal chamber for heating the substrate wafer interior to the anneal chamber; and
    a surface photovoltage detector disposed within the anneal chamber for detecting a surface charge of a surface of the substrate wafer, the surface photovoltage detector including:
        a laser for pulsing the substrate wafer surface generating said surface charge and for sensing dissipation of the generated surface charge; and
        a delay circuit for timing a delay between the generating pulse and the sensing pulse.

6. An anneal system according to claim 1 further comprising a plurality of heating lamps.

7. A dopant activation detector for detecting dopant activation in a substrate wafer disposed within an anneal system, said dopant activation detector comprising:
   a heating lamp disposed in the vicinity of the substrate wafer for heating the substrate wafer; and
   a surface photovoltage detector disposed within an anneal chamber for detecting a surface charge of a surface of the substrate wafer and for sensing dissipation of the surface charge.

8. A detector according to claim 7 further comprising:
   a controller coupled to the heating lamp for applying a heating control signal to the heating lamp and coupled to the surface photovoltage detector for receiving a signal indicative of a surface charge measurement detected by the surface photovoltage detector.

9. A dopant activation detector for detecting dopant activation in a substrate wafer disposed within an anneal system comprising:
   a heating lamp disposed in the vicinity of the substrate wafer for heating the substrate wafer; and
   a surface photovoltage detector disposed within an anneal chamber for detecting a surface charge of a surface of the substrate wafer, the surface photovoltage detector including:
      a first laser for pulsing the substrate wafer surface and generating said surface charge; and
      a second laser for sensing dissipation of the generated surface charge.

10. A dopant activation detector for detecting dopant activation in a substrate wafer disposed within an anneal system comprising:
   a heating lamp disposed in the vicinity of the substrate wafer for heating the substrate wafer; and
   a surface photovoltage detector disposed within an anneal chamber for detecting a surface charge of a surface of the substrate wafer, the surface photovoltage detector including:
      a laser for pulsing the substrate wafer surface generating said surface charge and for sensing dissipation of the generated surface charge; and
      a delay circuit for timing a delay between the generating pulse and the sensing pulse.

11. An anneal system for annealing a substrate wafer within, the anneal system comprising:
   an anneal chamber for annealing the substrate wafer positioned within the anneal chamber;
   a heating lamp disposed in the vicinity of the anneal chamber for heating the substrate wafer interior to the anneal chamber; and
   an optical detector disposed within the anneal chamber for detecting an electrical signal at a surface of the substrate wafer and for sensing variation of said electrical signal.

12. An anneal system according to claim 11 wherein:
   the anneal chamber is a rapid thermal anneal chamber for rapid thermal annealing the substrate wafer.

13. An anneal system according to claim 11 further comprising:
   a controller coupled to the heating lamp for applying a heating control signal to the heating lamp and coupled to the optical detector for receiving a signal indicative of an electrical measurement detected by the optical detector.

14. An anneal system according to claim 11 wherein the optical detector is an emission microscopy apparatus.

15. An anneal system according to claim 11 wherein the optical detector is an optical layer thickness detector.

16. An anneal system according to claim 12 further comprising a plurality of heating lamps.

17. An anneal system for annealing a substrate wafer within, the anneal system comprising:
   an anneal chamber for annealing the substrate wafer positioned within the anneal chamber;
   heating means disposed in the vicinity of the anneal chamber for heating the substrate wafer interior to the anneal chamber; and
   optical sensing means disposed within the anneal chamber for detecting a surface charge of a surface of the substrate wafer and for sensing dissipation of the surface charge.

18. An anneal system according to claim 17 wherein:
   the anneal chamber is a rapid thermal anneal chamber for rapid thermal annealing the substrate wafer.

19. An anneal system according to claim 17 further comprising:
   control means coupled to the heating lamp for applying a heating control signal to the heating lamp and coupled to the surface photovoltage detector for receiving a signal indicative of a surface charge measurement detected by the surface photovoltage detector.

20. An anneal system for annealing a substrate wafer within, the anneal system comprising:
   an anneal chamber for annealing the substrate wafer positioned within the anneal chamber;
   heating means disposed in the vicinity of the anneal chamber for heating the substrate wafer interior to the anneal chamber; and
   optical sensing means disposed within the anneal chamber for detecting a surface charge of a surface of the substrate wafer, the optical sensing means including:
      a first laser for pulsing the substrate wafer surface and generating said surface charge; and
      a second laser for sensing dissipation of the generated surface charge.

21. An anneal system for annealing a substrate wafer within, the anneal system comprising:
   an anneal chamber for annealing the substrate wafer positioned within the anneal chamber;
   heating means disposed in the vicinity of the anneal chamber for heating the substrate wafer interior to the anneal chamber; and
   optical sensing means disposed within the anneal chamber for detecting a surface charge of a surface of the substrate wafer, the optical sensing means including:
      a laser for pulsing the substrate wafer surface generating said surface charge and for sensing dissipation of the generated surface charge; and
      delay means for timing a delay between the generating pulse and the sensing pulse.

22. An anneal system according to claim 17 wherein the heating means includes a plurality of heating lamps.

* * * * *